(12) United States Patent
Setiabudi

(10) Patent No.: US 6,686,122 B1
(45) Date of Patent: Feb. 3, 2004

(54) PRODUCTION OF PHOTORESIST COATINGS

(75) Inventor: Frans Setiabudi, Eschbach (DE)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/868,817

(22) PCT Filed: Dec. 11, 1999

(86) PCT No.: PCT/EP99/09840

§ 371 (c)(1),
(2), (4) Date: Jun. 21, 2001

(87) PCT Pub. No.: WO00/38487

PCT Pub. Date: Jun. 29, 2000

(30) Foreign Application Priority Data

Dec. 22, 1998 (CH) .............................. 2529/98

(51) Int. Cl.$^7$ ................................. G03F 7/00
(52) U.S. Cl. .............................. 430/270.1; 430/281.1; 430/311; 430/315; 430/319; 430/322; 430/324; 430/325; 430/328; 430/330; 430/331
(58) Field of Search ......................... 430/270.1, 281.1, 430/311, 315, 319, 322, 324, 325, 328, 330, 331

(56) References Cited

U.S. PATENT DOCUMENTS

| | | | | | |
|---|---|---|---|---|---|
| 4,102,687 A | * | 7/1978 | Crivello | ..................... | 96/115 |
| 4,506,006 A | * | 3/1985 | Ruckert | .................... | 430/235 |
| 4,985,340 A | * | 1/1991 | Palazzotto et al. | .......... | 430/270 |
| 5,045,435 A | | 9/1991 | Adams et al. | | |
| 5,114,830 A | * | 5/1992 | Surber | ....................... | 430/280 |
| 5,124,233 A | | 6/1992 | Meier et al. | | |
| 5,268,255 A | * | 12/1993 | Kikuchi et al. | .............. | 430/280 |
| 5,296,334 A | * | 3/1994 | Castaldi et al. | .............. | 430/280 |
| 5,319,861 A | | 6/1994 | Tate | | |
| 5,362,607 A | * | 11/1994 | Crivello et al. | ............. | 430/326 |
| 5,372,915 A | | 12/1994 | Haley et al. | | |
| 5,501,942 A | | 3/1996 | Salvin et al. | | |
| 5,506,321 A | * | 4/1996 | Koto et al. | ................. | 526/273 |
| 5,527,659 A | | 6/1996 | Yamaoka et al. | | |
| 5,556,735 A | * | 9/1996 | Ivory et al. | ................. | 430/315 |
| 5,656,411 A | * | 8/1997 | Ivory et al. | ................ | 430/270.1 |
| 5,741,622 A | * | 4/1998 | Arima | ...................... | 430/270.1 |
| 5,821,031 A | * | 10/1998 | Hashimoto et al. | ....... | 430/280.1 |
| 5,853,957 A | * | 12/1998 | Yanagawa et al. | ........ | 430/280.1 |
| 5,932,654 A | * | 8/1999 | Ogawa et al. | ................ | 525/71 |
| 6,015,651 A | * | 1/2000 | Awaji et al. | ................ | 430/315 |
| 6,045,857 A | * | 4/2000 | Gupta | ......................... | 427/96 |
| 6,069,065 A | * | 5/2000 | Arimoto et al. | ............ | 438/612 |
| 6,087,417 A | * | 7/2000 | Stevenson et al. | .......... | 523/414 |
| 6,124,079 A | * | 9/2000 | Vermeersch et al. | ........ | 430/303 |
| 6,159,654 A | * | 12/2000 | Machida et al. | .......... | 430/270.1 |
| 6,248,225 B1 | * | 6/2001 | Palaika et al. | .............. | 204/484 |
| 6,284,440 B1 | * | 9/2001 | Hirano et al. | ............... | 430/331 |
| 6,291,027 B1 | * | 9/2001 | Emch | .......................... | 427/542 |
| 6,399,277 B1 | * | 6/2002 | Nojima et al. | ........... | 430/280.1 |
| 6,417,292 B1 | * | 7/2002 | Moriarity et al. | ........... | 525/440 |
| 2001/0003759 A1 | * | 6/2001 | Sato et al. | ................... | 522/109 |
| 2002/0169226 A1 | * | 11/2002 | Sato et al. | ................... | 521/100 |

FOREIGN PATENT DOCUMENTS

| | | |
|---|---|---|
| EP | 0 115 354 A2 | 1/1984 |
| EP | 0 346 522 A2 | 8/1988 |
| EP | 0 568 827 A2 | 4/1993 |
| JP | A-05 216227 A | 12/1993 |

OTHER PUBLICATIONS

Roos–Kozel, B. L. et al.: "The Advantages of Processing Polymer Thick Film Materials in an Infrared Furnace", Proceedings of the International Symposium of the Microelectronics, XP000671953, pp. 165–175 (1984).

* cited by examiner

Primary Examiner—Janet Baxter
Assistant Examiner—Amanda C. Walke
(74) Attorney, Agent, or Firm—Proskauer Rose LLP; Tiffany A. Levato; Kristin H. Neuman

(57) ABSTRACT

Process for the production of a resist coating, in which (a) a substrate is coated with a resist composition which comprises at least one component which absorbs radiation in the near infrared region with warming of the coating; and (b) the resist composition or a composition derived therefrom and obtained during the process is subjected at least once during the process to thermal treatment with the aid of radiation in the near infrared region.

20 Claims, No Drawings

PRODUCTION OF PHOTORESIST COATINGS

The present invention relates to a process for the production of a resist coating, and to the use of this process for the production of a primary resist coating, a solder-stop resist coating or for the sequential build-up of multilayer circuit boards.

Resist coatings are an essential tool in the production of modern circuit boards. Inter alia, a distinction is made here between so-called primary resists and solder-stop resists.

Primary resists are imagewise-structured coatings on a substrate which are intended to protect certain parts of the substrate for a temporary period against the effect of a certain treatment to which the substrate is subjected, for example when a copper-laminated laminate as substrate is to be subjected to an etch treatment, in which the copper is to be removed from certain areas of the laminate. After completion of this treatment, the primary resists are generally removed completely from the substrate again. The imagewise structuring of the primary resist coating is generally produced by imagewise exposure of a continuous layer of a resist material on the substrate, which chemically modifies the resist material at the irradiated points. With the aid of suitable developers, either the irradiated or the unirradiated areas of the resist coating can then be dissolved and the underlying substrate uncovered. In the case of certain resist types, for example chemically reinforced resists, it is necessary to subject the imagewise-exposed resist coating, before development, to extended heating in order to achieve adequate differentiation of the solubilities of irradiated and non-irradiated material in the developer.

Solder-stop resists, which cover virtually the entire surface of a ready-structured and assembled circuit board, with the exception of the areas at which contact of the printed circuit with a solder material during subsequent treatment of the circuit board with the solder material is desired, are generally not removed after completion of this treatment. The solder-stop resist remains on the circuit board as a protective coating, inter alia against environmental influences and for electrical insulation of the individual conductor tracks of the printed circuit from one another. In addition to a photocurable component system, which, as in the case of the primary resists, is employed for structuring the resist coating by imagewise exposure, if desired heating of the resist coating, and development, solder-stop resists frequently also comprise a purely thermally curable component system, which is only cured with the aid of heat after the structuring of the coating, and which improves the protective properties of the coating.

Owing to their good electrical insulation properties, solder-stop resist compositions are also used, in particular, in the sequential build-up of multilayer circuit boards. In this case, a first printed circuit is coated with a photoresist coating as insulation layer. This is structured by imagewise exposure, if desired heating of the resist coating, and development in such a way that holes are produced in the insulation layer at the points at which electrical connections of the first printing circuit to a further printed circuit applied to the insulation layer are later necessary. The structured resist layer is then, if necessary, thermally cured. The holes in the insulating resist layer are rendered electrically conductive, for example by copper plating, and the second printed circuit is then built up on the insulation layer in a known manner. The outlined procedure is, if desired, repeated one or more times to give multilayer circuit boards.

Whereas "non-thermal" process steps, for example photostructuring, in photoresist applications as mentioned above generally proceed relatively quickly, for example within a few seconds, thermal treatment steps require a significantly greater amount of time. These thermal treatment steps include, for example, predrying of the resist coating on the substrate, i.e. removal of a solvent, which frequently serves as carrier for application of the resist compositions to the substrate, and which generally requires from 20 to 30 minutes in conventional fan-assisted ovens. A similar amount of time may be necessary for the above-mentioned interim heating of the irradiated resist coating before development. In general, however, thermal final curing of solder-stop resist coatings is very particularly time-consuming, generally requiring treatment of the coating at temperatures in the region of about 150° C. for one hour or even longer. Although assembly-line plants, as generally usual today in circuit-board technology, are able to conceal the time needed for the thermal treatment steps in circuit board production, they require, however, very large ovens for this purpose and/or complex plants for transporting the assembly-line product into the ovens in order to ensure that the boards remain in the oven for a sufficiently long time at a given assembly line speed in order to complete the thermal treatment.

EP-A-0 115 354, Example 1, has already described the final curing of a ready-structured solder-stop mask coating by means of infrared radiation, but precise details of the wavelengths of the infrared radiation used are not given. From the information on the speed at which the coated circuit boards are moved past the infrared radiation source, it is evident that the final curing of a conventional circuit board takes at least six minutes or longer.

The present invention is based on the surprising knowledge that conventional resist compositions absorb radiation in the near infrared range particularly well owing to the polar components present in them, during which the compositions heat up sufficiently that the above-mentioned thermal treatment steps can be carried out within a few seconds, typically within from 1 to 60 seconds and often in less than 10 seconds. Also surprisingly, no technical disadvantages occur here, for example solvent inclusions during predrying or increased brittleness during the thermal curing. In addition, a significantly better degree of curing is generally achieved on use of near infrared radiation for the final curing of solder-stop resist layers.

The invention therefore relates to a process for the production of a resist coating, in which
(a) a substrate is coated with a resist composition which comprises at least one component which absorbs radiation in the near infrared region with warming of the coating; and
(b) the resist composition or a composition derived therefrom and obtained during the process is subjected at least once during the process to thermal treatment with the aid of radiation in the near infrared region.

In this application, the term radiation in the near infrared region is taken to mean, in particular, radiation having a wavelength of from about 760 to 1400 nm. Heating systems based on this radiation have been known for some time and are marketed commercially by, for example, Research Inc., US, or INDUSTRIESERVIS, DE, but have hitherto not been employed in resist technology and in the production of electrical circuit boards. The radiation employed according to the invention preferably essentially comprises radiation having a wavelength of from 760 to 999 nm.

The emitters for the near infrared radiation are preferably installed in such a way that they irradiate the entire width of the conveyor belt passed beneath, on which the substrates provided with the resist coating, for example the circuit boards, are moved forwards. It may be necessary to install a plurality of emitters alongside one another. The separation between the emitters and the belt and the power with which the emitters are operated are preferably optimized as a function of further process parameters, inter alia the specific resist composition, the thickness of the resist layer to be thermally treated, and the most suitable temperature for the desired thermal reaction, which is possible for the person skilled in the art using a few simple experiments.

There are no specific restrictions for the type of resist composition which can be used in the process according to the invention, or its constituents. However, the application of the resist composition must have at least one thermal process step if the advantages of the process according to the invention are to be realized. It must furthermore be ensured that the resist composition absorbs radiation in the near infrared region with warming. For this reason, it should advantageously have constituents containing polar functional groups which can be stimulated into thermal vibrations by the radiation in the near infrared region. This applies to virtually all resist compositions which are usual in circuit board technology. However, the compositions to be employed in the process according to the invention preferably comprise at least one crosslinkable compound containing (meth)acrylic or epoxide groups.

In general, the resist compositions employed in the process according to the invention comprise at least one photosensitive component system. "Photosensitive" for the purposes of this application means sensitive to UV and/or VIS radiation.

The photosensitive component system can be, for example, a chemically reinforced, positive-working system, i.e. a system which, after imagewise exposure of the coating and thermal treatment of the layer, is more soluble in the developer at the irradiated points than at the non-irradiated points. Positive resists based on a photosensitive component system of this type are described, for example, in EP-A-0 568 827. EP-A-0 295 211 describes another type of positive resist for whose use the process according to the invention likewise brings considerable time advantages, and which is also particularly suitable for the sequential build-up of multilayer circuit boards. In this positive resist, the catalyst present in the composition for thermal crosslinking of the composition is rendered inactive by irradiation, and thermal curing of the imagewise-exposed resist coating is subsequently carried out, accordingly resulting only in curing of the unexposed areas of the coating and thus, after development, in a positive mask copy in the resist layer. The thermal curing step necessary here, which usually requires from about 15 to 30 minutes, can likewise be shortened to a few seconds by use of radiation in the near infrared region.

The process according to the invention can furthermore be used for negative resists which comprise a photocurable or photocrosslinkable component system. Unless stated otherwise, "photocurable" and "photocrosslinkable" in this application are likewise intended to mean curable or crosslinkable with the aid of UV and/or VIS radiation. A photocurable component system frequently employed for negative resists is based, for example, on a free-radical photoinitiator and photopolymerizable monomers and/or oligomers, for example vinyl or (meth)acrylate monomers and/or oligomers as crosslinkable constituent, for example diethylene glycol diacrylate, trimethylolpropane triacrylate or pentaerythritol triacrylate. Photoinitiators which can be employed here are all conventional initiators for free-radical photopolymerization in the known and conventional amounts for this purpose. If desired, co-initiators may additionally be employed. A negative resist of this type is described, for example, in the U.S. Pat. No. 5,045,435. However, the process according to the invention is also suitable for cationically photopolymerizable resist types, for example based on onium salts as photoinitiators, for example sulfonium salts, and compounds containing more than one epoxide group per molecule. These resist types generally likewise have to be subjected to extended heating at temperatures of from above 80 to 100° C. between the imagewise exposure and development, this heating likewise requiring only a few seconds on use according to the invention of radiation in the near infrared region for heating the resist layer.

Particularly suitable resist compositions for the production of solder-stop resists or for the sequential build-up of circuit boards are those which comprise a photocurable component system and a thermally curable component system. The thermally curable component system may be based, for example, on an epoxide compound and a curing agent for this purpose, in particular a latent curing agent, for example dicyandiamide, optionally in the presence of chlorotoluron as accelerator. Further resist compositions which are particularly suitable, inter alia, for the production of solder-stop masks are described, for example, in EP-A-0 115 354 (based on organic solvents) or in EP-A-0 493 317 (based on water as carrier).

The coating of the substrate with the resist composition can be carried out by means of the conventional methods with which a coating can be applied uniformly. Examples of such coating methods are spin coating, brushing, spraying, for example electrostatic spraying, reverse-roll coating, dip coating and knife coating and the curtain-coating method. The application rate (layer thickness) and the type of substrate (layer supports) are dependent on the desired area of application. In general, the thickness of the layer before removal of the solvent should be from about 5 to 150 mm [sic], preferably from about 25 to 100 mm [sic], in particular from 25 to 75 mm [sic].

If the resist composition comprises a solvent, for example an inert organic solvent, water or a mixture of two or more than two of the said components, the solvent is preferably removed, after coating of the substrate, by thermal treatment of the composition with radiation in the near infrared region with formation of the resist coating. The power consumption and separation of the emitters from the coated substrate are preferably set in such a way that the predrying with formation of a resist coating on the substrate takes place for from 1 to 30 seconds, in particular for from 3 to 10 seconds. A further time advantage of the use according to the invention of radiation in the near infrared region during predrying consists in that the substrate, owing to the short heating time, is only heated to a temperature of from about 40 to 50° C., which means that, in contrast to conventional predrying, where the substrate generally has the oven temperature of from about 100 to 140° C. at the end of the predrying, any coating of the second side of the circuit board with fresh resist composition can be begun immediately without it being necessary to allow the circuit board to cool for up to several minutes in order to avoid exposing the circuit board to the risk of thermo-mechanical damage due to apparatus effects.

The removal of the solvent during predrying is particularly preferably carried out with simultaneous treatment of the surface of the coating with a gas stream, the gas being in particular flowing air. The treatment of the coating with the flowing gas can be carried out, for example, using a conventional air knife.

The predrying according to the invention with the aid of radiation in the near infrared region for removal of the solvent is suitable both for primary resist compositions and for solder-stop resist compositions.

After removal of solvent present in the composition, the substrate coated with the composition can be exposed imagewise in the conventional manner with UV/VIS radiation and then structured in accordance with this image with the aid of a suitable developer, as is generally conventional in this field. The imagewise exposure can be carried out, for example, with the aid of a mask, which is preferably laid on the predried resist coating, or by means of a laser beam, which is moved over the coating in such a way that imagewise irradiation of the coating takes place. Heating, which may be necessary after the exposure in order to achieve a sufficient solubility difference between the irradiated and non-irradiated areas of the resist coating, is likewise preferably carried out in accordance with the invention with the aid of radiation in the near infrared region. Heating of the coating which is sufficient for this purpose can generally likewise be carried out for a period of a few seconds, for example for from 1 to 30 seconds, in particular for from 1 to 10 seconds. It may be necessary to optimize the intensity and duration of the irradiation by means of a few experiments in such a way that any additional thermally curable component system which may be present in the resist is initiated during this process step to such an extent that structuring of the coating is not prevented by the subsequent development.

If the process according to the invention is employed for the application of a resist which, in addition to the photo-crosslinkable component system, additionally comprises a purely thermally crosslinkable component system, i.e., for example, for the application of a solder-stop resist, the thermally curable component system of the resist composition can be brought to reaction after the imagewise structuring of the resist coating by exposure and, if desired, heating, as well as development.

The thermally curable component system of the resist composition is preferably likewise cured using radiation in the near infrared region. The process according to the invention exhibits the greatest time advantages here compared with the conventional production of solder-stop resist coatings in which conventional thermal curing methods are used, since the usual curing time of about 1 hour can be reduced to about 5 seconds, i.e. by more than 700-fold.

In a specific embodiment of the process according to the invention, the substrate coated with a resist composition comprising a purely thermally curable component system is, after removal of solvent present in the composition by predrying, cured imagewise by means of radiation in the near infrared region and then structured in accordance with this image with the aid of a developer. The imagewise curing can be carried out, for example, through a mask which is insensitive to radiation in the near infrared region, i.e., for example, reflects the latter without warming in the process, for example through a metal mask. An essential advantage of this embodiment of the process according to the invention is that the resist composition does not have to comprise a photocurable component system, i.e. purely thermally curable component systems can be used as resist.

The process according to the invention can be employed in all cases where resists, in particular photoresists, are used, in particular for the production of primary resist coatings and solder-stop resist coatings in the production of circuit boards and for the sequential build-up of multilayer circuit boards with the aid of resists.

EXAMPLE

A resin mixture is prepared by dissolving 28.62 g of tris(2-hydroxyethyl) isocyanurate triacrylate (SR 368 from Cray Valley, Paris), 27.53 g of binder (obtained by heating 467 g of bisphenol A diglycidyl ether having an epoxide content of from 5.26 to 5.38 val/kg, 333 g of tetrabromo-bisphenol A, 200 g of triglycidyl isocyanurate and 0.05 [lacuna] of 2-phenylimidazole at 160° C. for three hours in accordance with EP-A-0 559 607, Example 1, and then mixing the resultant reaction product, after cooling to about 150° C., with 125 g of methyl ethyl ketone), 3.63 g of ethoxylated trimethylolpropane triacrylate (SR 454 from Cray Valley, Paris), 0.18 g of Byk 077 (antifoam from Byk Chemie) and 0.01 g of hydroquinone in 16.45 g of propylene glycol methyl ether acetate at 45–50° C. 5.02 g of Irgacure 819 (photo-initiator based on phosphine oxide) and 0.65 g of dicyandiamide (microfine) are added, and the mixture is homogenized using a dissolver. 17.91 g of talc are subsequently added without further heating. After cooling to room temperature, the homogeneous mixture is ground.

In order to prepare a curing agent mixture, 1.56 g of 2,4,6-trimercapto-s-triazine (ZISNET F from Sankyo Kasei Co. Ltd, Japan) and 0.11 g of chlorotoluron in 27.88 g of Dowanol PB 40 (mixture of propylene glycol methyl ether and propylene glycol butyl ether from DOW) with stirring. 0.11 g of Orasol Blue are then added, and the mixture is stirred for a further 10 minutes. After cooling to room temperature, 0.33 g of the surfactant/wetting agent FC 431 (from 3M) is added.

A solder-stop composition is prepared from 100 g of the resin mixture and 26.9 g of curing agent mixture. A copper-laminated laminate board is coated with the composition on a K control coater model 625 K 303 unit. (Setting of the coating unit: K 202 knife-coating attachment rod No. 9=125 microns; coating rate 5 m/min). The freshly coated copper laminate is left to stand in air for 20 minutes and subsequently dried at 80° C. for 30 minutes.

The copper laminate is then exposed to UV light having an energy of 1500 mJ/cm$^2$ through a structured mask. The solder-stop mask is developed using gamma-butyrolactone.

The full final curing of the solder-stop coating is carried out with the aid of a near infrared coating unit from IndustrieSerVis, Bruckmühl, Germany, within 20–28 seconds, using an irradiation system consisting of a water-cooled near infrared heating module (120 mm×250 mm) fitted with six high-power halogen lamps (2×2 kW outer lamps and 4×1 kW inner lamps), and the distance between the halogen lamps and the coated copper laminate is 12 cm.

Testing of the solder-stop coating gives the following properties:

Pencil hardness (Mitsubishi pencil): 6H;

Cross-hatch class in accordance with DIN 52 151: 1 to 2;

Methylene chloride stability:

The copper laminate to be tested is immersed in methylene chloride at room temperature.

Only after 40 minutes are the first bubbles evident on the surface of the solder-stop coating.

What is claimed is:

1. A process for the production of a resist coating, in which
   (a) a substrate is coated with a resist composition which comprises at least one component that absorbs radiation in the near infrared region with warming of the coating;
   (b) said resist composition or a composition derived therefrom and obtained during the process is subjected at least once during the process to thermal treatment with the aid of radiation in the near infrared region; and (c) the resist composition comprises at least one photosensitive component system.

2. A process according to claim 1, in which the composition comprises a solvent, and the solvent is removed by thermal treatment of the composition with radiation in the near infrared region, with formation of the resist coating.

3. A process according to claim 2, in which the removal of the solvent is carried out with simultaneous treatment of the surface of the coating with flowing gas.

4. A process according to claim 3, in which the flowing gas is air.

5. A process according to claim 1, in which the composition comprises an inert organic solvent, water or a mixture of two or more than two of the said components.

6. A process according to claim 1, in which the composition comprises a photocurable component system and a thermally curable component system.

7. A process according to claim 6, in which the substrate coated with the composition, after removal of any solvent present in the composition, is exposed imagewise to UV/VIS radiation and, if desired after heating, is structured in accordance with this image with the aid of a developer.

8. A process according to claim 7, in which the heating between the imagewise exposure and the development is carried out with the aid of radiation in the near infrared region.

9. A process according to claim 7, in which, after the imagewise structuring of the resist coating, the thermally curable component system of the resist composition is cured.

10. A process according to claim 9, in which the thermally curable component system of the resist composition is cured with the aid of radiation in the near infrared region.

11. A process according to claim 1, in which the substrate coated with the composition, after removal of any solvent present in the composition, is exposed imagewise to UV/VIS radiation and, if desired after heating, is structured in accordance with this image with the aid of a developer.

12. A process according to claim 11, in which the heating between the imagewise exposure and the development is carried out with the aid of radiation in the near infrared region.

13. A process according to claim 1, in which the resist composition comprises at least one crosslinkable compound containing (meth)acrylic or epoxide groups.

14. A process according to claim 1, in which the composition comprises a thermally curable component system based on an epoxide compound.

15. A process according to claim 1, in which the resist coating is a primary resist coating, a solder-stop resist coating, or a resist coating within a multilayer circuit boards.

16. A process according to claim 1, in which the resist composition does not comprise a photocurable component system and does comprise a thermally curable component system.

17. A process according to claim 16, in which the substrate coated with the composition, after removal of solvent present in the composition, is exposed imagewise to UV/VIS radiation and, if desired after heating, is structured in accordance with this image with the aid of a developer.

18. A process according to claim 17, in which the heating between the imagewise exposure and the development is carried out with the aid of radiation in the near infrared region.

19. A process according to claim 18, in which, after the imagewise structuring of the resist coating, the thermally curable component system of the resist composition is cured.

20. A process according to claim 19, in which the thermally curable component system of the resist composition is cured with the aid of radiation in the near infrared region.

* * * * *